(12) United States Patent
Sales Casals et al.

(10) Patent No.: US 10,209,290 B2
(45) Date of Patent: Feb. 19, 2019

(54) LOCATING OF PARTIAL-DISCHARGE-GENERATING FAULTS

(75) Inventors: Lluis-Ramon Sales Casals, Milan (IT); Stefano Franchi Bononi, Milan (IT); Roberto Candela, Palermo (IT); Manuel Lopez Gonzalez, Milan (IT)

(73) Assignee: PRYSMIAN S.P.A., Milan (IT)

( * ) Notice: Subject to any disclaimer, the term of this patent is extended or adjusted under 35 U.S.C. 154(b) by 715 days.

(21) Appl. No.: 13/977,280

(22) PCT Filed: Dec. 30, 2010

(86) PCT No.: PCT/EP2010/007982
§ 371 (c)(1),
(2), (4) Date: Sep. 20, 2013

(87) PCT Pub. No.: WO2012/089229
PCT Pub. Date: Jul. 5, 2012

(65) Prior Publication Data
US 2014/0002098 A1  Jan. 2, 2014

(51) Int. Cl.
*G01R 31/08* (2006.01)
*G01R 31/12* (2006.01)

(52) U.S. Cl.
CPC .......... *G01R 31/08* (2013.01); *G01R 31/1272* (2013.01); *G01R 31/086* (2013.01); *Y04S 10/522* (2013.01)

(58) Field of Classification Search
CPC .......... G01R 31/08; G01R 31/34; G01R 27/04
See application file for complete search history.

(56) References Cited

U.S. PATENT DOCUMENTS

| 4,967,158 A | 10/1990 | Gonzalez |
| 5,214,595 A * | 5/1993 | Ozawa ................. G01R 15/142 |
| | | 324/536 |

(Continued)

FOREIGN PATENT DOCUMENTS

| CN | 1790041 A | 6/2006 |
| CN | 201269916 Y | 7/2009 |

(Continued)

OTHER PUBLICATIONS

International Search Report from the European Patent Office for International Application No. PCT/EP2010/007982, dated Sep. 22, 2011.

(Continued)

*Primary Examiner* — Giovanni Astacio-Oquendo
*Assistant Examiner* — Alvaro Fortich
(74) *Attorney, Agent, or Firm* — Finnegan, Henderson, Farabow, Garrett & Dunner, L.L.P.

(57) ABSTRACT

A method of locating incipient faults that generate partial discharges in an AC power distribution system includes detecting at least one spike in a PD pattern generated by such system; getting the voltage wave of the AC power in the system; detecting a phase of such spike with respect to the voltage of the AC power; and locating an incipient fault where such phase is below a predetermined threshold. An apparatus includes at least one sensor of electrical pulses, means for getting a synchronism signal with a power supply of the power distribution system, and modules adapted to carry out the method.

12 Claims, 7 Drawing Sheets

(56) References Cited

U.S. PATENT DOCUMENTS

| | | | | |
|---|---|---|---|---|
| 5,272,439 | A * | 12/1993 | Mashikian | G01R 31/1272 324/520 |
| 5,416,418 | A * | 5/1995 | Maureira | G01R 31/083 324/532 |
| 5,530,364 | A * | 6/1996 | Mashikian | G01R 31/083 324/242 |
| 6,213,108 | B1 * | 4/2001 | Boyer | F02P 3/02 123/595 |
| 6,809,523 | B1 | 10/2004 | Ahmed et al. | |
| 6,853,196 | B1 | 2/2005 | Barnum et al. | |
| 7,388,384 | B2 | 6/2008 | Kato et al. | |
| 8,816,700 | B2 * | 8/2014 | Di Stefano | G01R 31/1272 324/536 |
| 2003/0206111 | A1 * | 11/2003 | Gao | G01R 31/008 340/635 |
| 2004/0032265 | A1 * | 2/2004 | Turner | G01R 31/085 324/522 |
| 2004/0204873 | A1 | 10/2004 | Freisleben et al. | |
| 2004/0263179 | A1 | 12/2004 | Ahmed et al. | |
| 2005/0200378 | A1 * | 9/2005 | Hobelsberger | G01R 31/1227 324/765.01 |
| 2008/0048710 | A1 * | 2/2008 | Cern | G01R 31/1272 324/536 |
| 2008/0061997 | A1 * | 3/2008 | Miyashita | H02H 1/0015 340/646 |
| 2008/0088314 | A1 * | 4/2008 | Younsi | G01R 31/1227 324/457 |
| 2009/0119035 | A1 * | 5/2009 | Younsi | G01R 31/343 702/58 |
| 2009/0146847 | A1 * | 6/2009 | Barkeloo | H03K 17/9622 341/20 |
| 2009/0177420 | A1 * | 7/2009 | Fournier | G01R 31/1272 702/59 |
| 2010/0073008 | A1 * | 3/2010 | Twerdochlib | G01R 31/1272 324/520 |
| 2011/0012586 | A1 * | 1/2011 | Montanari | G01R 31/1272 324/76.77 |
| 2011/0156720 | A1 | 6/2011 | Di Stefano et al. | |
| 2011/0193563 | A1 * | 8/2011 | Higgins | G01R 31/1272 324/551 |
| 2011/0248721 | A1 * | 10/2011 | Higgins | G01R 31/1272 324/537 |
| 2011/0256720 | A1 | 10/2011 | Hsu et al. | |
| 2012/0022809 | A1 * | 1/2012 | Serra | G01R 31/08 702/59 |
| 2012/0022810 | A1 * | 1/2012 | Serra | G01R 31/08 702/59 |
| 2012/0095710 | A1 * | 4/2012 | Bettio | G01R 31/1227 702/65 |
| 2012/0209572 | A1 * | 8/2012 | Cavallini | G01R 31/12 702/189 |

FOREIGN PATENT DOCUMENTS

| | | |
|---|---|---|
| CN | 201289497 Y | 8/2009 |
| JP | 3145916 | 3/2001 |
| WO | WO 96/20410 A1 | 7/1996 |
| WO | WO 2009/013639 A1 | 1/2009 |
| WO | WO 2009/150627 A2 | 12/2009 |

OTHER PUBLICATIONS

Kai, G., "Detection and Waveform Characteristic Analysis of GIS Partial Discharge", East China Electric Power, IIE133300, vol. 38, No. 10, pp. 1512-1517, (Oct. 2010).

Notification of the Second Office Action dated Oct. 19, 2015 by State Intellectul Property Office of the People's Republic of China in counterpart Chinese Application No. 201080070984.0 (11 pages).

Notification of the First Office Action from the State Intellectual Property Office of the People's Republic of China, in counterpart Chinese Application No. 201080070984.0 (dated Dec. 31, 2014).

Kai, G., "Detection and Waveform Characteristic Analysis of GIS Partial Discharge", East China Electric Power, IIE133300, vol. 38, No. 10, pp. 1512-1516, (Oct. 2010).

Office Action dated Jan. 30, 2018, from the Canadian Patent Office in counterpart Canadian Application No. 2,821,795.

* cited by examiner

LOCATING OF PARTIAL-DISCHARGE-GENERATING FAULTS

CROSS REFERENCE TO RELATED APPLICATION

This application is a national phase application based on PCT/EP2010/007982, filed Dec. 30, 2010, the content of which is incorporated herein by reference.

BACKGROUND OF THE INVENTION

Field of the Invention

The present invention relates to locating incipient faults that generate partial discharges.

More in particular, the present invention relates to a method for locating incipient faults that generate partial discharges in an electric power transmission system, in particular a medium/high voltage electric power transmission system, as well as to an apparatus for carrying out the method.

Background of the Related Art

In the present description and claims the terms:

"Medium Voltage" or MV is used to indicate voltages in a range from 1 to 35 kV;

"High Voltage" or HV is used to indicate voltages higher than 35 kV;

"incipient fault" is used to indicate a defect within an electric power transmission system, in particular within a cable, which will not cause immediate failure but which may lead to possible failure;

"locating" is used to indicate identifying a certain portion of power transmission system containing the incipient fault, the length of the portion representing the accuracy of the locating;

"partial discharge", sometimes shortened to PD hereinafter, is used to indicate a localized electrical discharge that partially bridges an insulation between conductors, and that can or cannot occur adjacent to a conductor.

Partial discharges are in general a consequence of local electrical stress concentrations in the insulation or on the surface of the insulation. Generally, such discharges appear as pulses having duration of much less than 1 μs. As insulation it is meant, for example, the insulating layer surrounding a conductor.

For the purpose of the present description and of the appended claims, except where otherwise indicated, all numbers expressing amounts, quantities, percentages, and so forth, are to be understood as being modified in all instances by the term "about". Also, all ranges include any combination of the maximum and minimum points disclosed and include any intermediate ranges therein, which may or may not be specifically enumerated herein.

In the present description and claims, the terms "conductive", "insulated", "connected" and other terms that might also have a thermal or mechanical meaning are used in the electrical meaning, unless otherwise specified.

Electric power from a power generating plant is typically transmitted to a user, such as a city, a factory or other entity, by means of medium/high voltage electric power transmission systems that may be aerial (overhead), terrestrial or submarine.

An electric power transmission system, or network, can comprise electric conductors (that may be aerial (overhead) conductors, insulated terrestrial conductors or insulated submarine conductors), junctions, terminations, insulators for aerial power systems, Gas Insulated Lines (GILs) and/or Gas Insulated Switches (GISes). As far as the aerial conductors are concerned, the invention relates to insulated aerial cables.

A partial discharge usually begins within voids, cracks, inclusions or other defects within a solid dielectric, at conductor-dielectric interfaces within solid or liquid dielectrics, or in bubbles within liquid dielectrics. Partial discharges can also occur along the boundary between different insulating materials.

As mentioned, partial discharges usually do not cause the immediate failure of the electrical system, rather its progressive deterioration, ultimately leading to electrical breakdown.

In electric power transmission systems, particularly medium and high voltage transmission lines, relatively small damage or defects to components, especially to cable portions, for example conductors, insulators or sheathing, can lead to appreciable current losses. Moreover, such damage tends to increase or propagate and may become the cause of short-circuits which lead to a switching-off of the relevant network portion, and under certain circumstances may even have the consequence of still greater damage to the network, causing correspondingly greater expenditure in repair, service interruption, etc.

It is therefore important to detect and monitor partial discharges in an electric power transmission system in order to ensure reliable, long-term operation of the system, to predict possible failures that might lead to the interruption of the power supply service, and to schedule suitable in situ checks and/or changes of the component that is generating the partial discharge activity, before its failure.

Due to the wide extension of an electric network and/or to the often difficult accessibility thereof, especially when it is underground or overhead, it is important to locate as precisely as possible the site of the incipient fault that generates the partial discharge.

Techniques to detect and locate partial discharges in an electric power transmission system are known in the art.

Some techniques use Time-Domain Reflectometry (TDR), a measurement technique used to determine the characteristics of electrical lines by observing reflected waveforms. TDR is based on the injection and propagation of a step or impulse of energy into a system, and the subsequent observation of the energy reflected by the system. The accuracy of this technique in locating an incipient fault generating partial discharges in general depends on several factors, including the length of the link, the accuracy in the velocity of propagation value that is chosen for the calculation, and the distortion of the pulses at the measurement point due to dispersion.

The accuracy may thus not be fully satisfactory, especially in long and/or complex power networks. Indeed, partial discharges need short energy impulses to be detected, but long cable portions need long energy impulses to be run through.

TDR provides the distance of the defect from the measurement point, which is usually an end of a cable. It is however not easy at all to know where such a point will actually be because of the three-dimensional, often irregular arrangement of the cable.

Among techniques using TDR, for example, U.S. Pat. No. 6,853,196 relates to a method for determining the location of a defect site in a cable which comprises injecting into the drive end of the cable a short-duration incident pulse having sufficient voltage to cause an electrical breakdown at the defect site. The electrical breakdown, in turn, generates pulses which propagate away from the defect site in both directions along the cable. At least one diagnostic sensor can detect the incident pulse and the breakdown-induced reflected pulse at the drive end of the cable. The location of the defect site is estimated from the time delay between the arrival times of the pulses and the propagation velocity of the pulses in the cable.

Other methods provide for allocating detecting sensors operatively connected to various points along the entire electric network. Taking into account the extension of an electric network, such methods result to be rather expensive.

For example, WO 2009/013639 relates to a method for detecting, identifying and locating partial discharges occurring in a discharge site along an electric apparatus. The method comprises a preliminary step of identifying a plurality of detection stations along the entire apparatus to be evaluated, whereat the sensor can be coupled for the detection of the electrical signals. The partial discharges are located at the station where the signals have maximum values of an amplitude parameter and of a shape parameter correlated to the frequency content of the signals.

WO 2009/150627 discloses a portable partial discharge detection device for detecting and measuring partial discharges in electrical components and apparatus, which delivers signals having a form much resembling that of the radiated pulse, and which can also detect and deliver a sync signal which is obtained by picking up the supply voltage of the discharge generating source object. The device comprises a wide-band antenna suitable for acting as an electric field sensor and comprising a first planar conductor cooperating with a second conductor whose profile converges towards the first planar conductor at one point or along a line, wherein said second conductor is smaller by about two orders of magnitude than the field wavelength to be detected, so that the wide-band antenna is non-resonant in a band from about 0.1 MHz to about 100 MHz.

U.S. Pat. No. 4,967,158 relates to a portable detector device for detecting partial electrical discharge in live voltage distribution cables and/or equipment. The device comprises a probe secured to an insulated portable handle for manual displacement of the probe. A detector device is connected to the probe for detecting a signal in the range of 5 to 10 MHz emitted by the partial discharge. The detector has an input attenuator circuit which is connected to the probe to lower the level of the detected signal to a desired level. A transformation circuit is further provided to change the detected signal to a predetermined frequency signal substantially free of noise and representative of the magnitude of the detected partial discharge signal. An amplifier circuit amplifies the predetermined frequency signal and an output circuit generates signals indicative of the presence and magnitude of the partial discharge. To determine the location of a partial discharge along a cable or joint, the probe is past gently and slowly over the insulated area and the detector meter is carefully observed to see where the readings reach maximum.

EP 800652 relates to methods and apparatus for locating incipient faults in electric power distribution cables which include the application of an excitation voltage to a power line to produce a partial discharge signal pulse at a fault along the power line. The surface of the power line is scanned with two sensors spaced apart along the power line and disposed adjacent the surface of the power line, to detect the partial discharge signal pulse to produce discrete detected pulses. These detected pulses are combined to produce a combined signal having an amplitude level which reaches an extreme value when the fault is located equidistantly between the sensors. The sensors are moved along the power line until the fault is located substantially equidistantly between the sensors as indicated by the extreme amplitude level of the combined signal.

SUMMARY OF THE INVENTION

The Applicant observed that the latter two methods require a quantitative and comparative evaluation to ascertain when the amplitude level of a signal is maximum. Moreover, the sensor of the latter two documents encircles the cable which cannot therefore be tested when buried.

US 2009/0177420 discloses that, in order to detect, localize and interpret a partial discharge occurring in a partial discharge site along an electrical equipment, two measurement probes and a synchronization probe are installed along the electrical equipment. The measurement probes detect pulses travelling in the electrical equipment while the synchronization probe detects a phase angle in the electrical equipment and is usable for calibration purposes. A control unit receives the signals sensed by the probes and conditions them. Digital processing applied on the conditioned signals, involving their correlation, a time-frequency distribution and a form factor estimation, allows establishing a diagnosis indicating a detection of a partial discharge and its localization along the electrical equipment. The disclosed method refers to the polarity of the signals from the two probes.

The Applicant faced the technical problem of providing a method for locating incipient faults that generate partial discharges in an electric power transmission system, which is accurate and simple.

The Applicant found that the above problem can be solved by observing the phase of a "spike" of a PD pattern with respect to the AC supply voltage, in that such phase tends to zero when the incipient fault position is approached and tends to 180° when the incipient fault position is overpassed.

In the present invention and in the attached claims, the term "PD pattern" indicates a diagram of electrical pulses in a plane representing amplitude versus phase with respect to the AC power supply voltage of the power distribution system.

Indeed the Applicant, during an activity of collection of PD data, has observed that the PD pattern has at least one "spike", i.e. a concentration of electrical pulses having substantially a same time delay with respect to the voltage curve of the AC power carried by the system. By further investigating, the Applicant has perceived that, surprisingly, the phase of this spike changes while changing the distance from the incipient fault that generates the PD, and is essentially null at the incipient fault location. In particular, while moving toward the incipient fault, the phase of the spike approaches zero, and while moving away from the incipient fault, the phase approaches 180°.

Accordingly, in an aspect the present invention relates to a method of locating incipient faults that generate partial discharges in an AC power distribution system, comprising the steps of:
  detecting a spike in a PD pattern generated by such system;
  getting the voltage wave of the AC power in the system;
  detecting a phase of such spike with respect to the voltage of the AC power;
  locating an incipient fault where such phase is below a predetermined threshold.

It is noted that, in principle, the incipient fault is at the position where the phase of the spike with respect to the voltage is null. The predetermined threshold is therefore selected so as to obtain a desired accuracy of the location, i.e. a reasonable length of the portion of the power distribution system to be physically inspected and repaired or substituted.

In the present description and claims, the term "phase" is used to indicate the time shift of the peak of a spike with respect to the voltage signal (the wave origin) of the AC power.

Preferably the method comprises the step of providing a reference signal being a signal synchronous with, i.e. having the same frequency as and being in phase with, the AC power supply.

The predetermined threshold is preferably less than or equal to 10°, more preferably less than or equal to 5°.

The length of the portion where the incipient fault is located (hereinafter also referred to as "location portion") is preferably less than about 2.5 m long, more preferably less than 1 m. For example, the location portion can be less than about 10 cm.

Advantageously, the method comprises the step of selecting a starting detecting position and selecting at least one subsequent detecting position in a first direction along the power distribution system, i.e. moving along the power distribution system in a first direction, as long as the phase decreases; and selecting at least one subsequent second detecting position in a second direction opposite the first direction, (i.e. inverting the direction of movement), if the phase increases.

In particular, the method comprises the sequential steps of:
 selecting a first position;
 noting at least one spike of the distribution of partial discharges at said first position, said spike having a first phase;
 selecting a second position as a position following said first position in a first direction along the power distribution system;
 noting at least one spike at said second position, having a second phase;
 if the second phase is smaller than the first phase, selecting a further position following said second position in the first direction along the power distribution system;
 if the second phase is greater than the first phase selecting a further position preceding said second position in the first direction along the power distribution system.

The spikes at the first and second positions are due to the same physical phenomenon linked to PD in the power distribution system.

In one embodiment the method comprises the step of decreasing the distance between consecutive positions as the phase decreases.

In another embodiment the method comprises the step of decreasing the distance between consecutive positions when the direction along with successive positions succeed each other is inverted.

Preferably the distance between consecutive positions is initially selected as about 2 meters.

Preferably the method comprises a preliminary step of coarsely locating the incipient fault in a portion of the power distribution system by a different, conventional technique, in particular by TDR, and wherein the positions lie within said portion.

Preferably, the method of the invention comprises the step of providing at least one, and more preferably a plurality of PD patterns, said step comprising detecting electrical pulses possibly representative of partial discharges in each detection position.

The detection preferably occurs for a time selected runtime such as to detect a number of electrical pulses sufficient for the PD pattern to have at least one well recognizable spike.

The detection time is preferably of from 10 to 60 seconds, preferably from to 30 seconds.

More preferably the method comprises the step of detecting electric pulses at each position through an apparatus, even more preferably through a portable apparatus.

More preferably the step of detecting electric pulses at each position is carried out through a contactless sensor.

The portable apparatus is adapted to get a synchronism signal with the power supply of the power distribution system, preferably through a contactless probe.

In an embodiment the method of the invention is carried out in a live power distribution system.

In another embodiment the method of the invention is carried out under test conditions, for example by providing a test voltage to an electrical cable, in order e.g. to perform quality control during the commissioning of the cable.

The analysis of the partial discharges and the notation of the phase is preferably made by a human operator.

However, the above steps may also be automated, e.g. by providing for a hardware, software or firmware module adapted to identify a spike and store and/or output a phase value associated therewith; and/or to evaluate a variation of phase between measurement positions; and/or to indicate in which direction the operator should move based upon such evaluation.

The above module preferably is adapted to count the dots at each phase value or at each narrow range of phases, and find the maximum of the counts.

Thus, in another aspect the invention relates to an apparatus for locating incipient faults that generate partial discharges in a power distribution system, comprising at least one sensor of electrical pulses (possibly representative of partial discharges), a means for getting a synchronism signal with a power supply of the power distribution system, and modules adapted to carry out the steps of the above method.

Preferably the means for getting a synchronism signal is a contactless probe.

In another aspect the present invention relates to a method of locating incipient faults that generate partial discharges in an AC power distribution system, comprising the steps of:
 providing a plurality of PD patterns each at one of a corresponding plurality of positions along the power distribution system,
 detecting a phase of a spike of each PD pattern with respect to the voltage of the AC power; and
 locating an incipient fault of the power distribution system about the position where the absolute value of the phase is the minimum.

BRIEF DESCRIPTION OF THE DRAWINGS

The features and advantages of the present invention will be made apparent by the following detailed description of some exemplary embodiments thereof, provided merely by way of non-limiting examples, description that will be conducted by making reference to the attached drawings, wherein.

DETAILED DESCRIPTION OF THE INVENTION

When an AC power supply system (for example a cable) is monitored, in order to detect possible electromagnetic signals corresponding to partial discharges, one can detect electric pulses corresponding to dots in a amplitude versus phase diagram as those shown in FIGS. 4 to 15. The pattern of such pulses is indicated with the reference pC in FIG. 6 (the same reference applies to FIGS. 7-15 and 4-5, too).

FIGS. 4-15 also show the voltage signal wave (kV in FIG. 6, but the same reference applies to FIGS. 7-15 and 4-5, too) of the AC power carried in the system where the pulses are detected.

When certain pulses in the PD pattern are generated with a substantially constant time delay (phase φ) with respect to the origin of the voltage signal wave, they concentrate and give origin to a detectable "spike" 21 in the graph. Said spike can be accompanied by a twin spike 22 spaced by 180° in the PD pattern. Generally, spike 21 is more apparent than twin spike 22.

Figure 1:
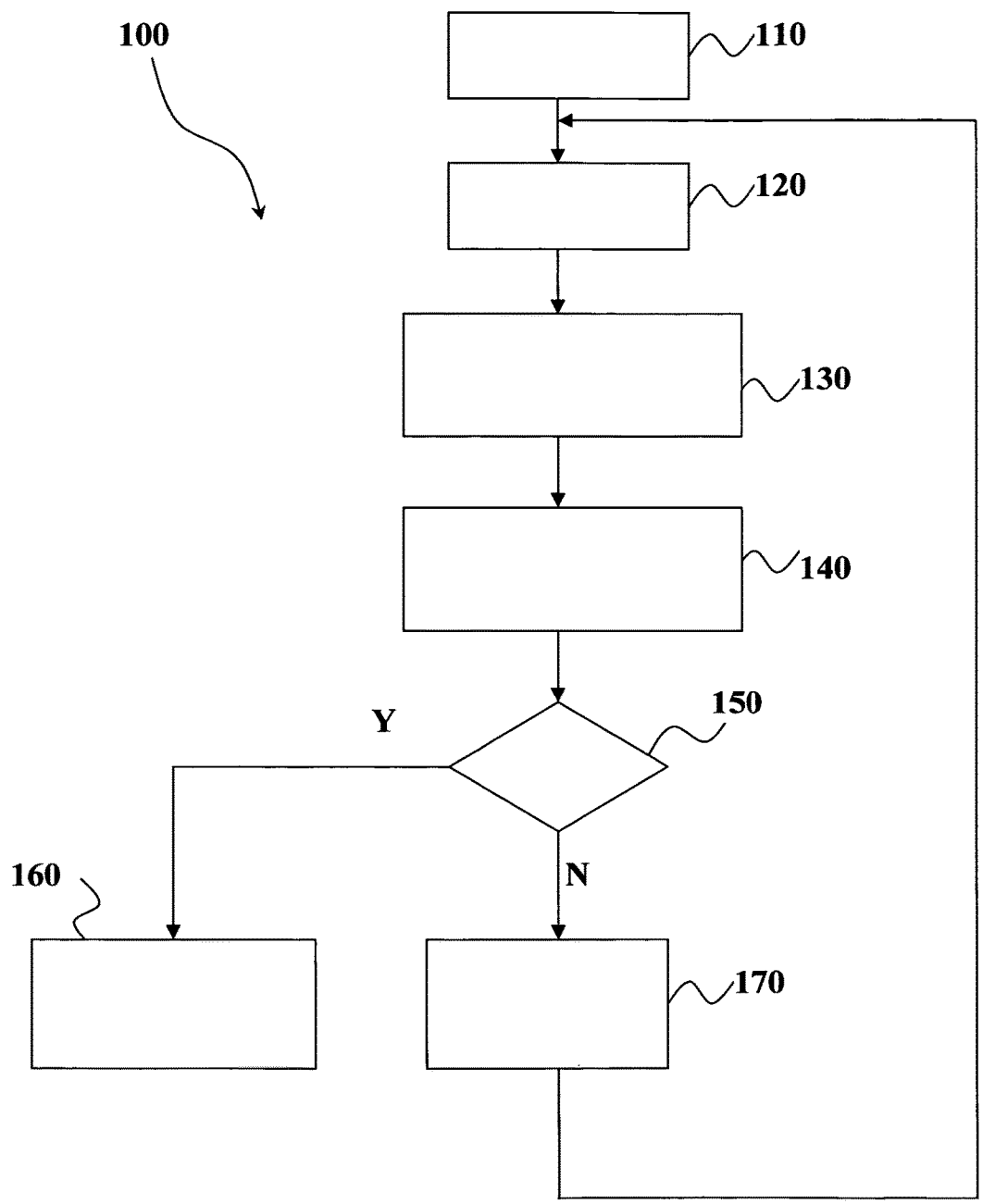
FIG. 1 shows a flow chart of an embodiment of the method of the invention.
Figure 3:
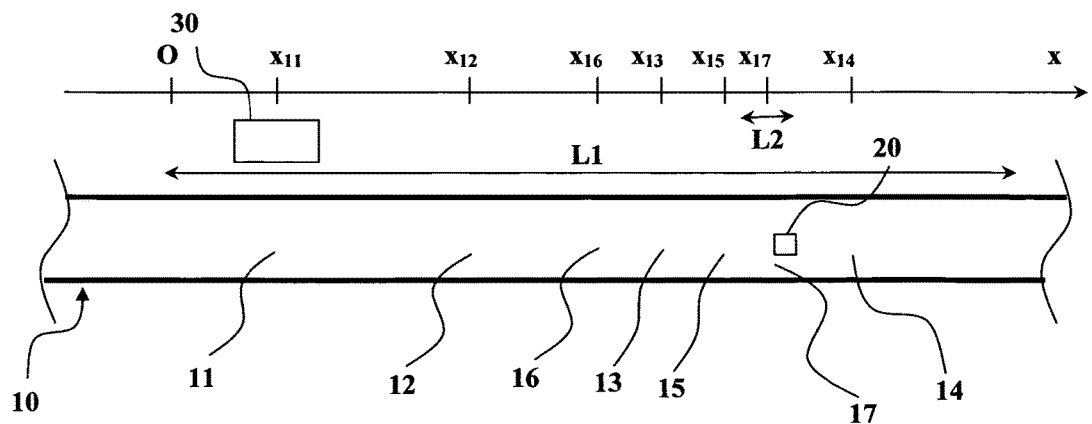
FIG. 3 diagrammatically shows a power distribution system and an embodiment of the method of the invention applied thereto.

FIG. 1 shows a flow chart of an embodiment of the method 100 of the invention of locating incipient faults that generate partial discharges in a power distribution system 10, which is diagrammatically shown in FIG. 3. In FIG. 3 power distribution system 10 is shown as a portion of a cable, and a cable will be referred to hereinbelow for the sake of brevity. It should however be understood that the power distribution system 10 may be or include any electrical component or equipment or combination thereof, such as junctions, terminations, insulators, etc. Moreover, it should be understood that while the cable 10 is shown as rectilinear in FIG. 3, it may have and in general will have any progression departing from a rectilinear progression, even a three-dimensional progression.

In optional step 110 of method 100, a preliminary, coarse location of the incipient fault 20 is made according to any conventional technique, such as for example a TDR technique. In this step, a portion of length L1 of power distribution system 10 is identified as containing the incipient fault 20. The size of length L1 depends on the accuracy of the used technique, but is generally comparatively large, in the order of at least tens of meters, with respect to the portion of length L2 that the method of the invention is intended to identify as containing the incipient fault 20.

When optional step 110 is performed, the subsequent steps are carried out on the coarsely identified portion of length L1 of cable 10; otherwise the steps 120-170 set forth in FIG. 1 are carried out on the entire length of power transmission system being examined.

To carry out the method of the invention, the cable 10 is powered with an AC power supply. This may be the mains power supply when the method of the invention is carried out on a "live" power distribution system. In case the method is carried out in laboratory or in factory, for example as a quality test, an AC power supply is properly provided for, and the outer screen of the cable is connected to mass or earth to simulate the conditions when the cable is in use.

To carry out the method of the invention an apparatus 30 for detecting partial discharges can be used. A suitable apparatus 30 is for example that disclosed in the abovementioned WO 2009/150627, said document being fully incorporated herein by reference.

The apparatus 30 comprises at least one sensor capable of detecting electrical pulses, means for generating a reference signal—referred to as sync signal hereinbelow—, and output means.

Such a sync signal is a sinusoidal signal having the same frequency as, and in phase with, the AC power supply.

The sensor of apparatus 30 is preferably a high frequency (HF) sensor, in the range of some MHz to some tens of MHz, because as it is well known electric pulses associated with partial discharges have a high frequency.

The output means of apparatus 30 are adapted to output an amplitude and a phase of each detected electrical pulse, preferably as a set of dots in an amplitude versus phase plane of a screen. More specifically, the amplitude of each pulse is the maximum amplitude thereof, and the phase of each pulse is the phase of the sync signal when the pulse has such maximum amplitude. Such pulse amplitude vs. phase output is briefly referred to as "PD pattern" hereinbelow, even though it will of course represent partial discharges only when there are indeed partial discharges.

The dots of a set, i.e. the dots forming a given PD pattern, may be collected for a given acquisition time, and/or in a given number, and/or until the above described spike of the PD pattern is recognizable. The apparatus 30 preferably comprises resetting means, such as a pushbutton or a software version thereof, for clearing the screen and starting a new collection of dots.

The apparatus 30 may provide for visually outputting other quantities and data, and may also comprise means for outputting an audio signal, besides means for outputting computer readable data, e.g. for connection to other electronic apparatus, to a peripheral such as an external memory or a printer etc.

The apparatus 30 may further comprise memory means for the above quantities, signal-conditioning and processing means and/or input means as well known in the art. Just by way of an example, the electric pulses detected by the sensor may be amplified and/or filtered and/or compared with a threshold or trigger to output only significant dots etc. The input means may be provided to control the operation of the apparatus, such as to start and stop the detection of electrical pulses, to reset the PD pattern as said, to change relevant parameters, such as the amplifier gain, trigger level etc., as well as to set user preferences. The input means may be controlled by a user or by a computer or computer readable medium.

The electric pulse sensor, and any probe of the sync generating means of the apparatus 30, are preferably of the contactless type, e.g. of the inductive or capacitive type, so as to minimize the setup time of the apparatus 30 and increase safety for a human operator. Even more preferably, the apparatus 30 is capable of detecting partial discharges through a medium other than air, so as to be suitable for performing the method on live underground cables.

A suitable range of operating distances transversally of the power distribution system or cable 10 is considered to be 100 cm or below. Indeed, it should be noted that increasing the operating distance brings about a decreased accuracy of the position along the power distribution system, and therefore a decreased accuracy in locating the incipient fault. Moreover, as the distance increases, the sensor reliability decreases.

The various components of apparatus 30 may be housed in one or more housings, and may be connected to each other by means of wired or wireless connections, e.g. in a WiFi network. The whole apparatus 30, or at least its sensor, is preferably of the portable type.

Turning back to FIGS. 1 and 3, the disclosed embodiment of the method of the invention is a recursive method.

In step 120, a first position 11 is selected along the portion of length L1 of cable 10 of FIG. 3. Neglecting the position about the cable 10, i.e. in a plane transversal to the cable 10, a reference system comprising an axis x extending along cable 10 is assumed with the origin O of axis x at one end—the left end in FIG. 3—of the portion of length L1. It is understood that in case of a non-rectilinear power transmission system 10, the reference system will be a curvilinear axis or any other suitable reference system. The first position 11 has a coordinate $x_{11}$ in the reference system. The first position 11 is preferably selected as the first end of the portion of length L1 of cable 10 being examined ($x_{11}=0$), or close thereto, as shown in FIG. 3.

In step 130, the sensor of apparatus 30 of FIG. 3 is coupled (through a wired or wireless coupling as said above) with the cable 10 at the first position 11, and a suitable plurality of electrical pulses are detected at such position 11 so that a first PD pattern at the first position 11 is obtained.

In step 140, a feature of the first PD pattern is recognised or noted, and a first phase $\varphi_{11}$ related thereto is noted. More specifically, the considered feature is a spike—i.e. a concentration of dots having nearly the same phase and a range of amplitude values—that, as disclosed in the introductory portion of the present application, appears in the PD pattern in the presence of an incipient fault 20 along the portion of length L1 of the power distribution system 10.

As already said and as will be detailed in the following, said spike can be accompanied by a twin spike spaced by 180° in the PD pattern. An example of a pattern having such a spike 21 and the twin spike 22 can be seen in FIGS. 6-15, commented below in the section "Experimental result".

It should be noted that step 140 is preferably carried out by a human operator. In this case, step 140 involves considering the PD pattern with a certain degree of carefulness, but does not necessarily require a quantitative analysis.

A hardware, software or firmware module may also be provided that is adapted to identify a spike and store and/or output to an operator a phase associated therewith. The spike identification may for example be carried out by counting the dots at each phase or at each narrow range of phases, and finding the maximum of the counts.

In step 150, the phase $\varphi_{11}$ is compared with a predetermined threshold $\varphi_0$. In the case that already at this execution at the first position the phase $\varphi_{11}$ is smaller than or equal to the predetermined threshold $\varphi_0$, in other words if the spike is very near 0°, in step 160 the incipient fault 20 is located as being at the first position 11 or in close proximity thereto, in other words in a portion of length L2 about the first position 11, and the method ends. This is not the case shown in FIG. 3.

In case comparison step 150 reveals that the phase value $\varphi_{11}$ is larger than the predetermined threshold $\varphi_0$, i.e. it is far from 0°, a step 170 of selecting a direction along the power distribution system 10 is carried out. In the first execution of step 160, and if the first position has been selected as close to a first end of the portion of length L1 of cable 10 that is being examined as detailed above ($x_{11} \cong 0$), the direction is preferably selected as that going towards the opposite end of portion of length L1, namely that of increasing x. It should be noted however that at the first execution of step 170, the direction could also be arbitrarily selected as that of increasing x or that of decreasing x. In further executions of step 170, the direction is selected applying the criteria discussed below.

Step 120 is then returned to, and in this further (second, then third etc.) execution thereof, a further position (second, then third position 12, 13 etc.) that follows the previous position (first, then second position 11, 12 etc.) in the selected direction along the power distribution system 10 is selected. Thus, under the above assumption, the second position 12 has a coordinate $x_{12} > x_{11}$.

Steps 130, 140, 150 are then repeated at this further position 12, 13, . . . Thus, in step 130 the sensor of apparatus 30 is coupled with the cable 10 at the further position 12, 13, . . . , and a suitable plurality of electrical pulses are detected at such position so that a further (second, then third etc.) PD pattern at the further position 12, 13, . . . is obtained. In step 140, a spike as a feature of the further PD pattern is recognised, and a further phase (second, then third phase $\varphi_{12}$, $\varphi_{13}$ etc.) related thereto is noted. In step 150, the further phase $\varphi_{12}$, $\varphi_{13}$, . . . is compared with the predetermined threshold $\varphi_0$. If the further phase $\varphi_{12}$, $\varphi_{13}$, . . . is smaller than or equal to the predetermined threshold $\varphi_0$, the incipient fault 20 is located as being at the further position 12, 13, . . . or in close proximity thereto, in other words in a portion of length L2 about the further position 12, 13, . . . and the method is terminated. This is not the case shown in FIG. 3.

In case comparison step 150 reveals that the further phase value $\varphi_{12}$, $\varphi_{13}$, . . . is larger than the predetermined threshold $\varphi_0$, then in step 170 of selecting a direction along the power distribution system 10, the further phase $\varphi_{12}$, $\varphi_{13}$, . . . is compared with the previous (first, then second, etc.) phase $\varphi_{11}$, $\varphi_{12}$, . . . If the comparison reveals that the phase is decreasing, i.e. if $\varphi_{12}<\varphi_{11}$, $\varphi_{13}<\varphi_{12}$ etc., then the previously selected direction is maintained. If conversely the comparison reveals that the phase is increasing, or is unchanged, i.e. if $\varphi_{12} \geq \varphi_{11}$, $\varphi_{13} \geq \varphi_{12}$ etc., then the direction opposite the previously selected direction is selected.

Figure 2:
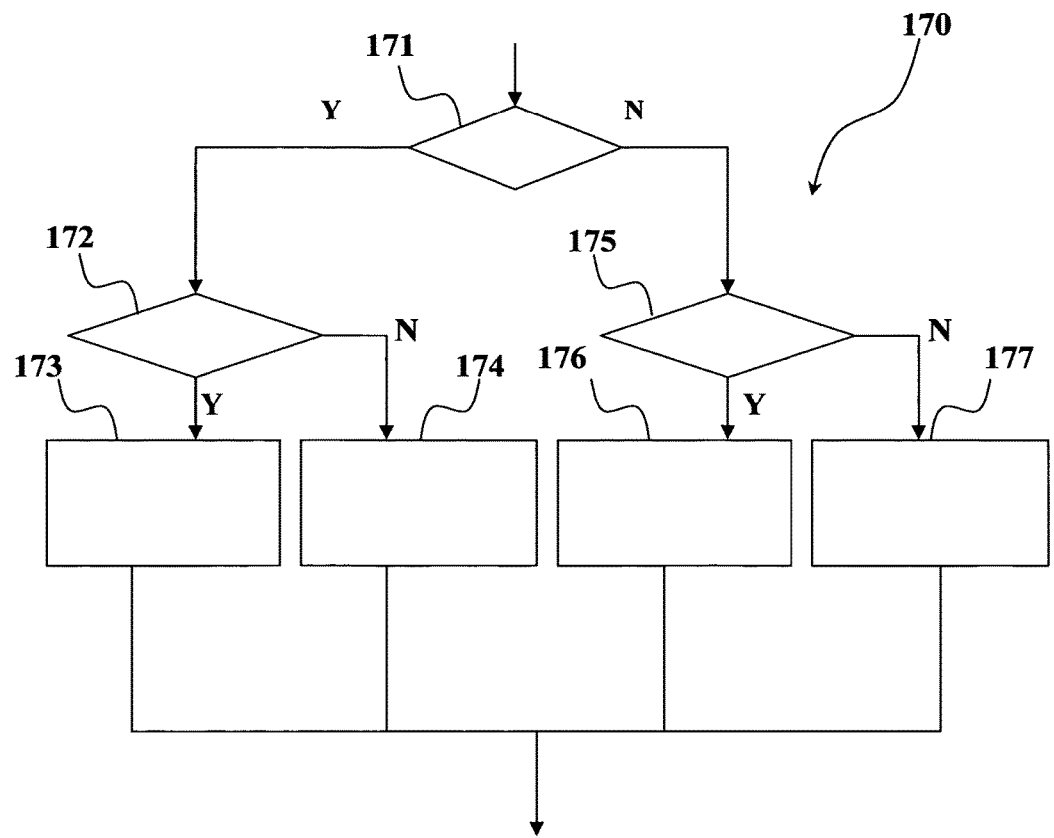
FIG. 2 shows a flow chart of an embodiment of one step of the method of FIG. 1.

FIG. 2 is a flow chart of an exemplary embodiment of the above described step 170. In step 171 it is checked whether $\varphi_i <= \varphi_{i-1}$. In the affirmative case, in step 172 it is checked whether the coordinate of the further position (i.e. the current position) $x_i$ is greater than the coordinate of the previous position $x_{i-1}$. In the affirmative case, in step 173 the direction of movement is selected so that the next position has a coordinate $x_{i+1}$ greater than the coordinate of the current position $x_i$; in the negative case, in step 174 the direction of movement is selected so that the next position has a coordinate $x_{i+1}$ smaller than the coordinate of the current position $x_i$.

If step 171 has a negative outcome, i.e. if $\varphi_i > \varphi_{i-1}$, in step 175 it is again checked whether the coordinate of the further position (i.e. the current position) $x_i$ is greater than the coordinate of the previous position $x_{i-1}$. In the affirmative case, in step 176 the direction of movement is selected so that the next position has a coordinate $x_{i+1}$ smaller than the coordinate of the current position $x_i$; in the negative case, in step 177 the direction of movement is selected so that the next position has a coordinate $x_{i+i}$ greater than the coordinate of the current position $x_i$.

In FIG. 3, positions 11, 12, 13, 14, 15, 16, 17 are shown for the example case that $\varphi_{12}<\varphi_{11}$, $\varphi_{13}<\varphi_{12}$, $\varphi_{14} \geq \varphi_{13}$, $\varphi_{15}<\varphi_{14}$, $\varphi_{16} \geq \varphi_{15}$, so that the direction along the cable 10 is inverted twice.

Moreover, the distance between positions consecutively selected is preferably reduced after an inversion of direction, as schematically shown in FIG. 3 at the inversion of direction at position 14, so that the positions become denser or crowded as the incipient fault 20 is approached and/or overpassed.

It is to be emphasized that the above detailed algorithm implements the criteria of:
continuing to moving along the power distribution system 10 in a same direction as long as the phase of the peak of the PD pattern is decreasing, and
inverting the direction when the phase increases.

In the proximity of the incipient fault 20, these criteria may actually happen to cause a "mistake", i.e. to go away from the incipient fault 20 instead of approaching it. Indeed, when the phase decreased with respect to the previous position, such as from position 14 to position 15 of FIG. 2, the above rule assumes that the current position 15 is still on the same side of the incipient fault 20 as the previous position 14, while the incipient fault 20 has actually been overpassed. The mistake gets to be amended when, going from position 15 to position 16, the phase shift is found to be increasing, and the direction is accordingly inverted.

To take that "mistake" into account, the method of the invention can provide to disregard the latest position when the phase increased after a decrease, in other words to pretend to still be at the last but one position before applying the criteria of inverting the direction and shortening the distance between measurement positions. So, in FIG. 3 from position 16 to position 17 a distance longer than the distance from position 15 to position 16 is shown, notwithstanding the fact that at position 16 an inversion in the direction occurred. This is because position 17 is indeed at a distance from position 15 smaller than the distance previously applied. It will easily be understood however that even without this additional criterion of disregarding the latest position when the phase increased after a decrease, the "mistake" is soon recovered, arriving at the right of position 15 for example in two steps instead of only one.

Thus, these mistakes are only temporary, and the method will sooner or later self-recover, in other words by applying the above criteria, together with a proper selection of the distances between consecutive positions, the positions are inherently converging towards the incipient fault 20.

It should be noted that further criteria may be used to select the positions, i.e. the direction along which they follow each other and/or their mutual distance, and/or to decide when to stop the execution of the method. For example, the previous two or more phases may be taken into account instead of only the previous one as in step 171, and/or the magnitude of the phases, or of the increase or decrease in consecutive phases. And, the threshold $\varphi_0$ may be adapted to the rate of change of the phase of the spike of the PD pattern along the cable 10, i.e. its "speed" of movement on the screen in comparison with the speed of movement along the cable 10. The criteria here should be that of identifying a cable portion of length L2 containing the incipient fault 20 that has a size that allows a thorough inspection in a time- and cost-effective manner.

Thus, especially when the method of the invention is performed by a human operator, the above detailed algorithm is meant to serve as guidance, but the operator could use his/her own judgement.

The predetermined threshold $\varphi_0$ is preferably selected as sufficiently small, for example of about 5°. The portion of length L2 is, for example, about 2 meters long, but can be advantageously much shorter than that, even of a few centimeters.

As another example, instead of decreasing the distance between consecutive positions after the inversion of direction, another criterion might be that of alternating closely spaced positions with more widely spaced positions. In so doing, the phase shift between closely spaced positions will indicate on which side of the defect one is, avoiding the above risk of mistake, while widely spaced positions may speed up the method when the phase value is still large.

It should be noted that, although the method of the invention is preferably performed runtime with the detection of electric pulses as disclosed, it may also be performed in different times, first collecting a plurality of PD patterns at a corresponding plurality of positions along the cable 10, and then analysing the plurality of PD patterns to locate the incipient fault 20 at or near the position corresponding to the PD pattern having a spike at the smallest phase.

The above described hardware, software or firmware module may also be adapted to evaluate the phase variation between measurement positions, namely whether the phase is increasing or decreasing, and to indicate in which direction the operator should move based upon such evaluation, e.g. by a suitable audio and/or visual output.

The sync signal may be a sinusoidal signal having the same frequency as, but a predefined phase offset with the AC power supply, provided that such phase offset is known and suitably taken into account when considering the phase of the peak of the PD pattern. More specifically, the spike of the PD pattern is expected to approach a correspondingly offset phase, instead of zero degrees, when the fault is approached. A reference signal can however be derived from the sync signal to account for the predefined phase offset, so that the spike of the PD pattern with respect to this reference signal will approach zero degrees.

Experimental ResultS

FIGS. 4-5 and 6 to 15 show the experimental results based, respectively, on a known, coarse method and on a method according to the invention, applied to a high voltage cable under test conditions.

A bobbin of high voltage cable was subject to quality control.

Quality control detected a partial discharge activity of about 15 pC magnitude.

In a preliminary step, a reflectometric technique was used to prelocate the point of PD activity. More specifically, using a propagation speed of 165 m/microsecond, the electric length of the cable in bobbin was found to be 1046 m, which matched with the physical length of the bobbin. By the reflectometric technique, an incipient fault was located at 166 m from the outer end of the cable bobbin, whereat measurement took place—i.e. 880 m from the opposite, free end of the cable.

A further measure by the reflectometric technique, carried out at the inner end of the cable bobbin, provided an electric length of the cable of about 1030 m, and located the incipient fault at 863 m therefrom, i.e. at 167 m from the outer end of the cable bobbin.

It is noted that the two measurements of length of the bobbin differed by 16 m, so that a similar inaccuracy in the location of the incipient fault was expected.

The cable was unwound from the bobbin and simultaneously wound onto a drum, so that the outer end of the original cable bobbin became the inner end of the second bobbin, which will be referred to hereinafter. The cable was cut at 172 m from the inner end, so that the fault was expected to be in a portion of length L1, of about 12 m, near the new free end, hereinafter referred to as the near end (and indeed at about 5-6 m from the near end according to the reflectometric technique). Such a portion of length of about 12 meters was left unwound from the drum.

The unwound portion of length L1 of cable was then subject to the method of the invention, in order to accurately locate the incipient fault that generated partial discharges where the phase of the spike of the PD pattern was near 0°.

The cable screen was connected to earth at both cable ends, so as to simulate the installation conditions, and a 36 kV power source was connected at the free end thereof. The opposite end of the cable, i.e. the inner end of the second bobbin, is referred to as far end.

Two apparatus model PryPAD manufactured by Prysmian S.p.A., Milano, Italy, were provided, which are capable of detecting the partial discharges and of providing the sync signal. Each apparatus was provided with one sensor, one of the apparatus using a wired connection to a PC, and the other one using a wireless connection to the PC.

Figure 4:
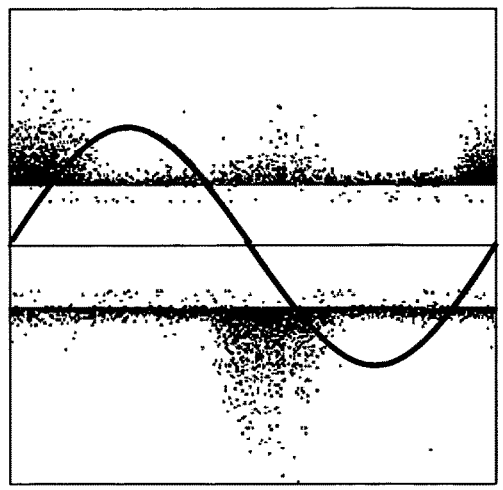
FIGS. 4 and 5 show experimental data obtained with a known method.
Figure 5:
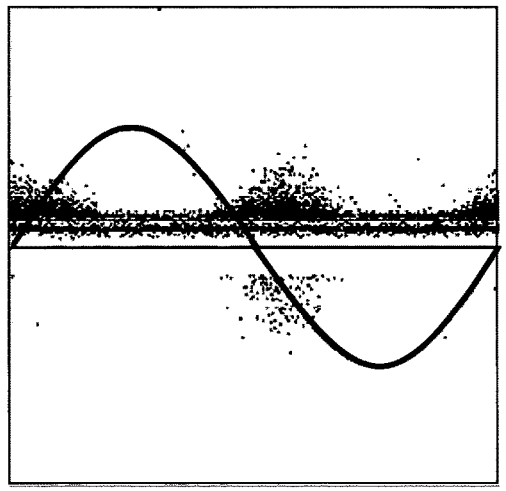

FIG. 4 shows the PD pattern at the far end, i.e. meter 172 in a coordinate system having its origin at the near end, as will be referred to hereinbelow. FIG. 5 shows the PD pattern at the near end of the cable, i.e. at meter 0. The electric pulse vs. phase patterns, i.e. the PD patterns, were detected.

In both cases, the presence of PD activity (but not the location) can be readily recognised by those skilled in the art, from the typical pattern of the electric pulses, which confirmed that there is an incipient fault along the cable.

Figure 6:
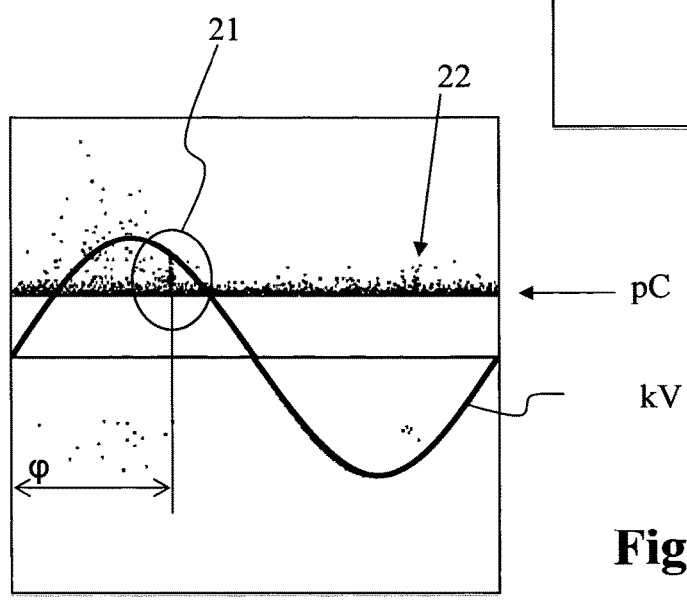
FIGS. 6 to 15 show experimental data obtained with the method of the invention.

The starting position of the method of the invention was selected as a position just outside of the drum, i.e. about meter 12 in the above reference system. FIG. 6 shows the PD pattern pC at this starting position, obtained with the wireless apparatus. It is to be noted that this PD pattern pC taken along the cable differs substantially from those taken at ends of the cable, both in phase distribution and in amplitude distribution. It is also apparent that the PD pattern has a spike 21 and a twin spike 22. With reference to the voltage signal wave kV, spike 21 has a phase φ of about 123°. Twin spike 22 has a phase shifted of about 180° with respect to phase φ of spike 21.

The presence of twin spike 22 proved that the spikes were not due to noise or other causes, but were indeed due to partial discharges at an incipient fault.

Though not shown, references pC and kV also applies to FIGS. 7-15 and FIGS. 4-5.

Figure 7:
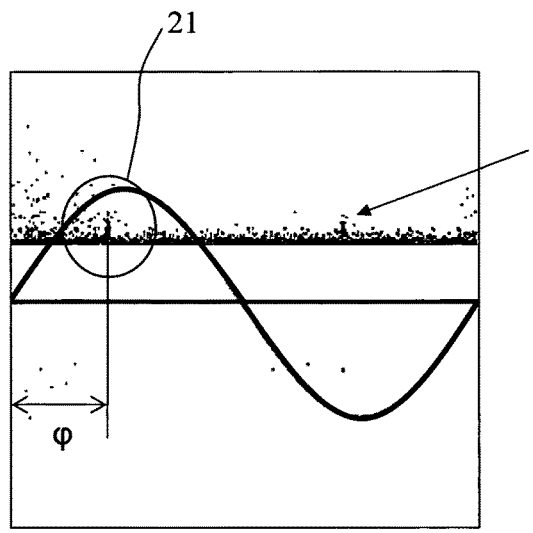

The sensors were then moved of about 1 meter toward the near end, so that a second position of the method of the invention was selected to be at about meter 11. FIG. 7 shows the PD pattern related to the wired sensor. Spikes 21, 22 can again be easily recognized, and spike 21 has a phase φ of about 80°, i.e. the phase decreased of about 40°.

Figure 8:
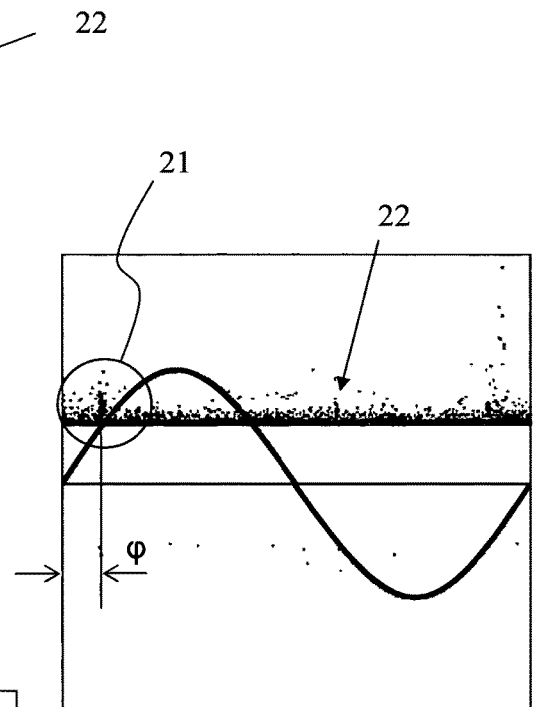
Figure 9:
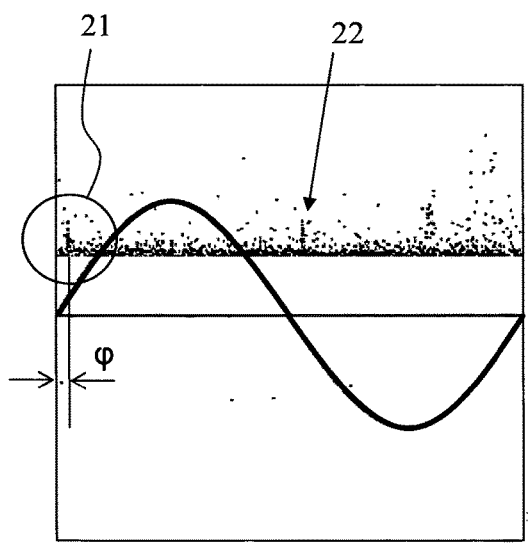
Figure 10:
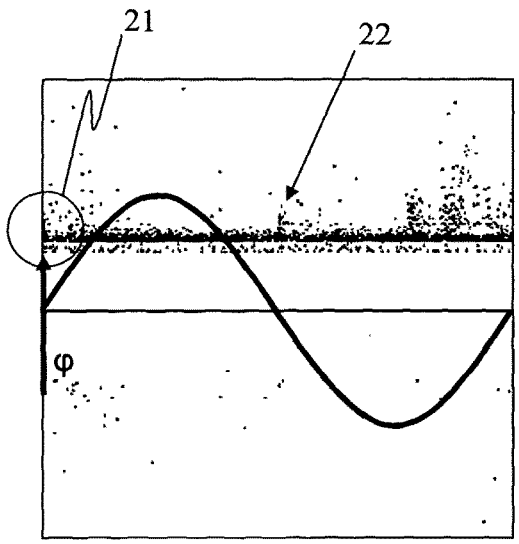

The sensors were again moved of about 1 meter toward the near end, so that a third position of the method of the invention was selected to be at about meter 10. FIG. 8 shows the PD pattern related to the wired sensor. Spikes 21, 22 can again be easily recognized, and spike 21 has a phase φ of about 34°, i.e. the phase decreased by about 45°.

Figure 16:
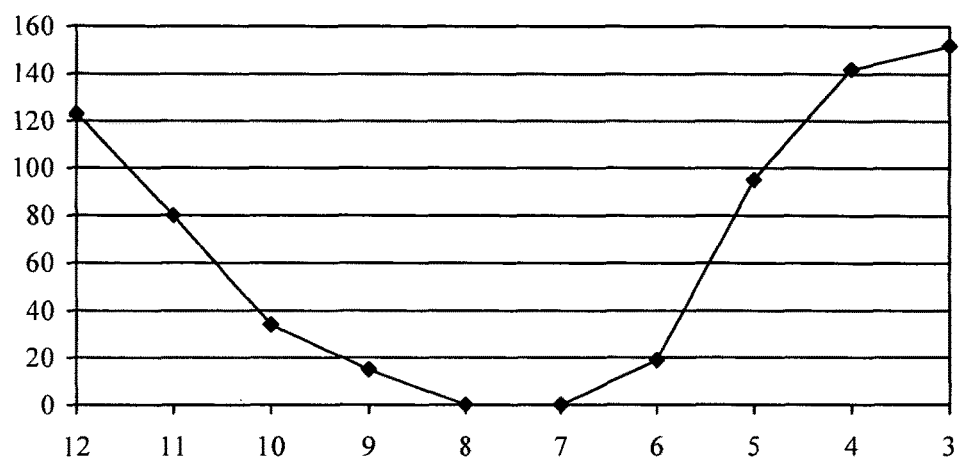
FIG. 16 is a graph showing experimental results.

Continuing moving the sensors, the electric pulses were detected at other positions spaced 1 meter apart towards the near end. FIGS. 9 to 15 show the corresponding electric pulses vs. phase patterns, or PD patterns. It is noted that each pattern shows a pair of spikes 21, 22. The phase, with respect to the sync signal, of the first spike 21 at each position is given in the table below. A graphical representation of the values is provided in FIG. 16.

TABLE

| Position from near end (meters) | Phase (degrees) wrt sync |
|---|---|
| 12 | 123 |
| 11 | 80 |
| 10 | 34 |
| 9 | 15 |
| 8 | 0 |
| 7 | 0 |
| 6 | 19 |
| 5 | 95 |
| 4 | 142 |
| 3 | 152 |

Figure 11:
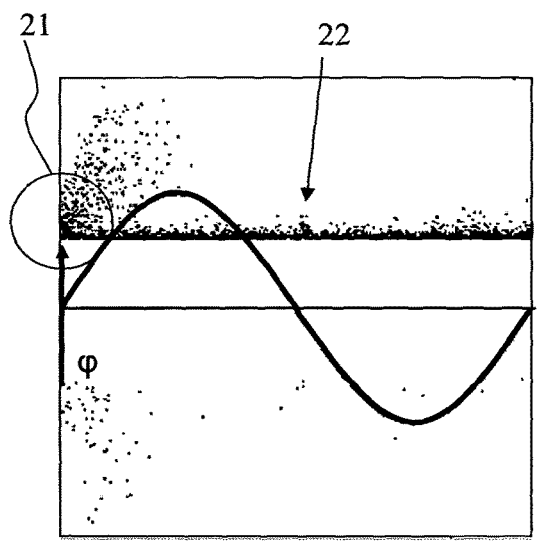
Figure 12:
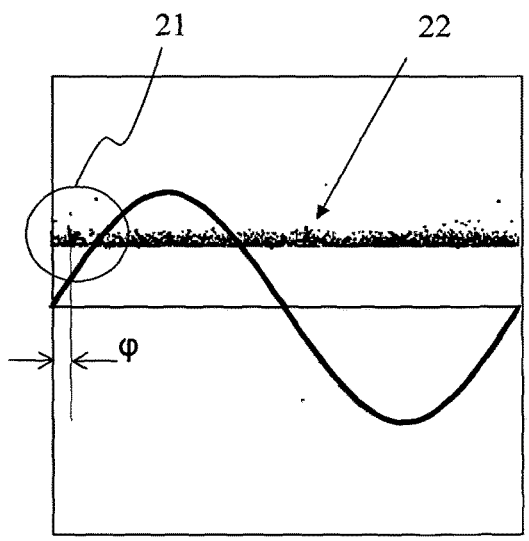
Figure 13:
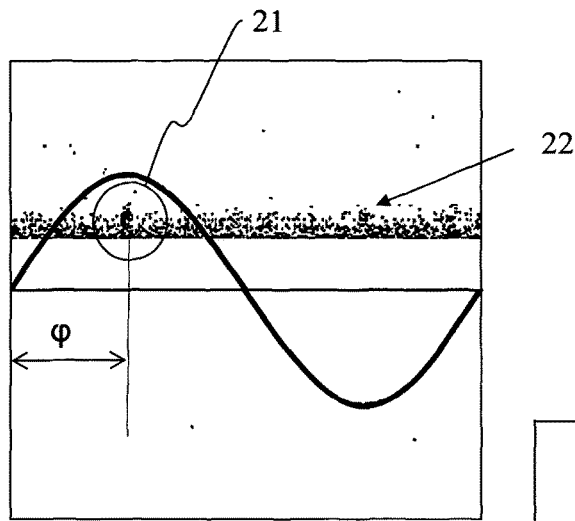
Figure 14:
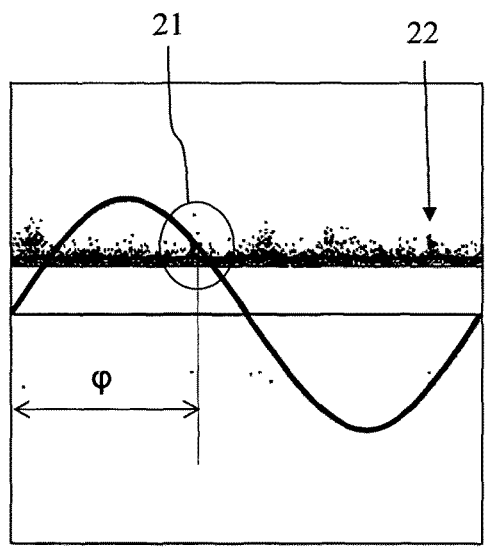
Figure 15:
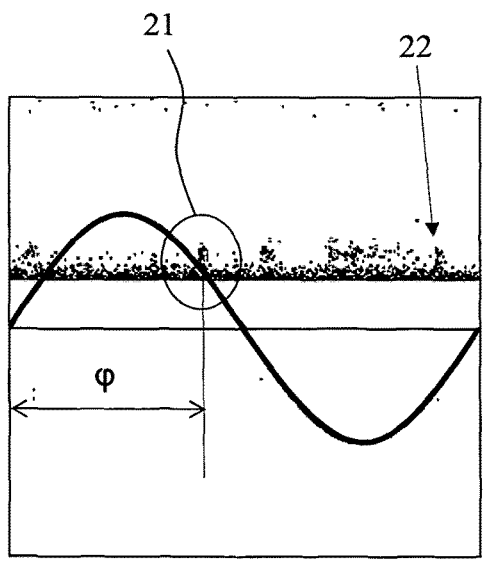

It is noted that the phase initially decreases towards 0°, and the spike 21 is very close to 0° at the positions at 8 and 7 meters (corresponding to FIGS. 10 and 11, respectively), and in the latter position other features appear. In particular, FIG. 11 shows the PD pattern at a position at meter 7. It is noted that it resembles more closely the patterns that are typically correlated with PD activity, such as that of FIGS. 4 and 5. Anyway, the spike 21 at 0° can still be recognized according to the invention.

To double-check that the incipient fault was properly located, the sensors were moved in the same direction, i.e. again toward the near end, to the positions at meter 6, 5, 4 and 3. FIGS. 12 to 15 show the PD pattern related to the wired sensor. Spikes 21 and twin spikes 22 can again be easily recognized, and spike 21 has an increasing phase, of about 19°, 95°, 142°, 152°, respectively. This proved that the incipient fault had been overpassed, and is located at about the position between 8 and 7 meters.

Electrical pulses were newly acquired at shorter distances walking about that position, and the PD patterns confirmed the above criteria, that the spike moves towards phase 0° when the incipient fault is approached, and moves towards phase 180° when walking away from the incipient fault.

A short portion of length L2 of cable was then cut at a distance from 5.75 meters to 8.25 meters from the near end (about 2.5 meters long) to comprise the points showing spike 21 very close to 0°. The appearance of the above discussed further features at 7 meters (as from FIG. 11) gave a hint about the possibility to find a defect more near to 7 meters than to 8 meters from the near end.

The cut portion of length L2=2.5 m of cable was then visually inspected and a defect was found at about 7.05 m, i.e. 5 cm from meter 7, i.e. at the position where it had been hypothized with the method of the invention.

The defect consisted of a gas bubble of 3 mm diameter between the insulation and the external semiconductive layer of the cable.

It is recalled that the reflectometric technique indicated a defect at 166-167 m from the inner end of the second bobbin, i.e. at meter 5-6 in the above coordinate system. Thus, the reflectometric technique had an inaccuracy of 1-2 meters on this amount of cable length.

The invention claimed is:

1. A method of locating incipient faults that generate partial discharges in an AC power distribution system, comprising:
    collecting a partial discharge pattern at a position of the AC power distribution system through an electric apparatus, the electric apparatus comprising at least one sensor of electrical pulses;
    detecting at least one spike in the partial discharge pattern generated by such system, the at least one spike including a concentration of electrical pulses;
    getting a voltage wave of AC power in the system;

detecting a phase of the spike with respect to voltage of the AC power;

locating an incipient fault at the position of the AC power distribution system if the detected phase of the spike with respect to voltage of the AC power is below a predetermined threshold; and inspecting, repairing, or substituting only a portion of the AC power distribution system at the position when the detected phase of the spike is below the predetermined threshold.

2. The method according to claim 1, wherein the predetermined threshold is less than or equal to 10°.

3. The method according to claim 2, wherein the predetermined threshold is less than or equal to 5°.

4. The method according to claim 1, wherein an incipient fault is located in a power distribution system portion of length shorter than 2.5 m.

5. The method according to claim 4, wherein an incipient fault is located in a power distribution system portion of length shorter than 1 m.

6. The method according to claim 1, comprising selecting a starting detecting position and selecting at least one subsequent detecting position in a first direction along the power distribution system, as long as the phase decreases; and selecting at least one subsequent second detecting position in a second direction opposite the first direction, if the phase increases.

7. The method according to claim 6, comprising decreasing a distance between consecutive positions as the phase decreases.

8. The method according to claim 6, comprising decreasing a distance between consecutive positions when a direction along with successive positions succeed each other is inverted.

9. The method according to claim 1, comprising a preliminary step of coarsely locating the incipient fault in a portion of the power distribution system by a conventional technique.

10. The method according to claim 1, comprising providing a plurality of partial discharge patterns, comprising detecting electrical pulses possibly representative of partial discharges in each detection position.

11. The method according to claim 10, wherein detecting electrical pulses lasts for a time selected runtime of 10 to 60 seconds.

12. The method according to claim 11, wherein detecting electrical pulses lasts for a time selected runtime of 15 to 30 seconds.

* * * * *